(12) United States Patent  
Yang

(10) Patent No.: US 7,244,652 B2  
(45) Date of Patent: Jul. 17, 2007

(54) METHOD OF FORMING A SPLIT PROGRAMMING VIRTUAL GROUND SONOS MEMORY

(75) Inventor: Jinsheng Yang, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 311 days.

(21) Appl. No.: 10/711,258

(22) Filed: Sep. 6, 2004

(65) Prior Publication Data

US 2006/0079055 A1   Apr. 13, 2006

(51) Int. Cl.
*H01L 21/336* (2006.01)

(52) U.S. Cl. ............... 438/261; 438/287; 257/E21.679

(58) Field of Classification Search ............... 438/216, 438/261, 279, 287, 591, 954; 257/E21.679
See application file for complete search history.

(56) References Cited

U.S. PATENT DOCUMENTS 6,248,633 B1 *   6/2001   Ogura et al. ................ 438/287
6,759,290 B2 *   7/2004   Ogura et al. ................ 438/287

* cited by examiner

*Primary Examiner*—Chandra Chaudhari
(74) *Attorney, Agent, or Firm*—Winston Hsu

(57) ABSTRACT

A method of forming an SPVG SONOS memory. First, a substrate having a well and a plurality of select gate structures is provided. Then, a plurality of sacrificial spacers are formed alongside each select gate structure, and an implantation process is performed to form a doped region in the well between any two adjacent select gate structures. Afterward, the sacrificial spacers are removed, and a composite dielectric layer is formed on the select gate structures and the substrate. Finally, a plurality of word lines are formed on the composite dielectric layer.

16 Claims, 6 Drawing Sheets

METHOD OF FORMING A SPLIT PROGRAMMING VIRTUAL GROUND SONOS MEMORY

BACKGROUND OF INVENTION

1. Field of the Invention

The present invention relates to a method of forming a nonvolatile memory, and more particularly, to a method of forming an SPVG SONOS memory.

2. Description of the Prior Art

Nonvolatile memories have the advantages of maintaining stored data while the power supply is interrupted, and thus have been widely employed in recent years. According to the bit numbers stored by a single memory cell, nonvolatile memories are divided into single-bit storage nonvolatile memories, including nitride-based non-volatile memories such as Nitride Read-Only-Memory (NROM), Metal-Oxide-Nitride-Oxide-Silicon (MONOS) memories or Silicon-Oxide-Nitride-Oxide-Silicon (SONOS) memories, and dual-bit storage nonvolatile memories, such as split program virtual ground SONOS (SPVG SONOS) memories, and SPVG MONOS memories. Comparing to the traditional single-bit storage memories, the SPVG SONOS memories and SPVG MONOS memories are capable of storing more data, and thus have gradually become more and more popular in the memory device market.

Please refer to FIG. 1 and FIG. 2. FIG. 1 and FIG. 2 are schematic diagrams of an SPVG SONOS memory 10, where FIG. 1 illustrates the SPVG SONOS memory 10 during a programming operation, and FIG. 2 illustrates the SPVG SONOS memory 10 during an erasing operation. It is appreciated that only a single memory cell is illustrated in FIG. 1 and FIG. 2 for clearly demonstrating the structure and operational theorem of the SPVG SONOS memory 10. As shown in FIG. 1, the SPVG SONOS memory 10 is formed on a P well 12, which includes a select gate 14, and two N buried bit lines, respectively serving as a source 16 and a drain 18, positioned on the opposite sides of the P well 12. The SPVG SONOS memory 10 further includes a gate insulating layer 20 between the select gate 14 and the P well 12, and a cap layer 22 above the select gate 14. In addition, the SPVG SONOS memory 10 further includes a bottom silicon oxide layer 24, a silicon nitride layer 26, and a top silicon oxide layer 28 on the select gate 14 and the P well 12. The silicon nitride layer 26 works as a storage medium for trapping electrons or hot holes. Furthermore, the SPVG SONOS memory 10 has a word line 30 positioned on the top silicon oxide layer 28.

As shown in FIG. 1, the SPVG SONOS memory 10 is programmed by a source-side injection mechanism. The voltage operations are as follows: the world line 30 is applied with a high positive voltage (e.g. 6 to 9V); the select gate 14 is applied with a low positive voltage (e.g. 1V); the source 18 is applied with a positive voltage (e.g. 4.5V); and the P well 12 and the drain 16 are maintained at 0V. Under these voltage operations, electrons which traverse the channel underneath the select gate 14 will be captured and trapped in the silicon nitride layer 26 close to the source 18 (as the arrow marks shown in FIG. 1) to store a bit of data. In addition, under similar inverse voltage operations, electrons can be trapped in the silicon nitride layer 26 close to the drain 16 to store another bit of data.

As shown in FIG. 2, the SPVG SONOS memory 10 is erased by a band-to-band hot hole injection mechanism. The voltage operations are as follows: the world line 30 is applied with a high negative voltage (e.g. −6 to −9V); the source 18 is applied with a positive voltage (e.g. 4.5V); the select gate 14 is maintained at a level lower than the threshold voltage, and the P well 12 and the drain 16 are maintained at 0V. Under these voltage operations, hot holes in the P well 12 will inject to the silicon nitride layer 26 close to the source 18, and neutralize the electrons trapped in the silicon nitride layer 26. Similarly, the electrons trapped in the silicon nitride layer 26 close to the drain 16 can be neutralized under similar inverse voltage operations.

Please refer to FIG. 3 to FIG. 6. FIG. 3 to FIG. 6 are schematic diagrams illustrating a conventional method of forming an SPVG SONOS memory. For easy illustration, only parts of memory cells are shown. As shown in FIG. 3, a substrate 50 including a P well 52 is formed, and a plurality of select gate structures 54 are positioned on the P well 52. Each select gate structure 54 from bottom to top includes a gate insulating layer 56, a select gate 58, and a cap layer 60. The gate insulating layer 56 is a silicon oxide layer formed by a thermal oxidization process or a deposition process, the select gate 58 is a polysilicon layer, and the cap layer 60 is a silicon nitride layer or a polycide.

As shown in FIG. 4, a composite dielectric layer (ONO tri-layer dielectric) 62 including a bottom silicon oxide layer 64, a silicon nitride layer 66, and a top silicon oxide layer 68 are formed on the substrate 50 and the select gate structures 54. Thereafter, a silicon oxide layer 70 is deposited as sacrificial spacers to be formed later.

As shown in FIG. 5, an etching back process is performed to entirely etch back the silicon oxide layer 70 for forming sacrificial spacers 72 alongside each select gate structure 54. The etching back process is not stopped until the composite dielectric layer 62 is open so as to form an opening 74 between any two adjacent sacrificial spacers 72. Thereafter, an implantation process is performed to form a plurality of N doped regions 76, which serve as buried bit lines, in the P well 52 via the openings 74. Afterward, an insulating layer (not shown) is entirely deposited on the top silicon oxide layer 68 and on the N doped regions 76, and an etching back process is performed to form a blocking film 78 on each N doped region 76.

As shown in FIG. 6, an etching process is then performed to remove the sacrificial spacers 72. A polysilicon layer 80 is totally deposited, and a photolithography and etching process is performed to define word lines 80.

As described, the process for forming the N doped regions 76 is performed after forming the composite dielectric layer 62 according to the conventional method. In other words, the composite dielectric layer 62 between any two adjacent sacrificial spacers 72 must be removed before forming the N doped regions 76. In addition, the blocking film 78 has to be formed before forming the word lines 80, or alternatively another silicon oxide layer (not shown) has to be formed after removing the sacrificial spacers 72 to avoid short circuits between the word lines 80 and the N doped regions (buried bit lines) 76. It is appreciated that even though the short circuit problem is avoided by forming the blocking film 78, other factors, such as the incompletion of the composite dielectric layer 62, the remaining etching stress, and the etching infirmity, may cause damages to the SPVG SONOS memory. For example, a higher voltage difference between the word lines and the buried bit lines may be necessary when performing the erasing operation, or a current leakage problem may occur. This leads to tunneling between the word lines and the buried bit lines, and reduces the reliability of SPVG SONOS memory.

SUMMARY OF INVENTION

It is therefore a primary objective of the present invention to provide a method of forming an SPVG SONOS memory to overcome the problems of the conventional method.

According to a preferred embodiment, a method of forming an SPVG SONOS memory is provided. First, a substrate including at least a first conductive type well is positioned in the substrate, and a plurality of select gate structures arranged in parallel and positioned on the first conductive type well are provided. Then, a plurality of sacrificial spacers alongside each select gate structure are formed. Thereafter, an implantation process by utilizing the select gate structures and the sacrificial spacers as a mask is performed to form a second conductive type doped region in the first conductive type well between two adjacent select gate structures. The sacrificial spacers are then removed, and a composite dielectric layer covering the select gate structures is formed. Finally, a plurality of word lines perpendicular to the select gate structures on the composite dielectric layer are formed.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
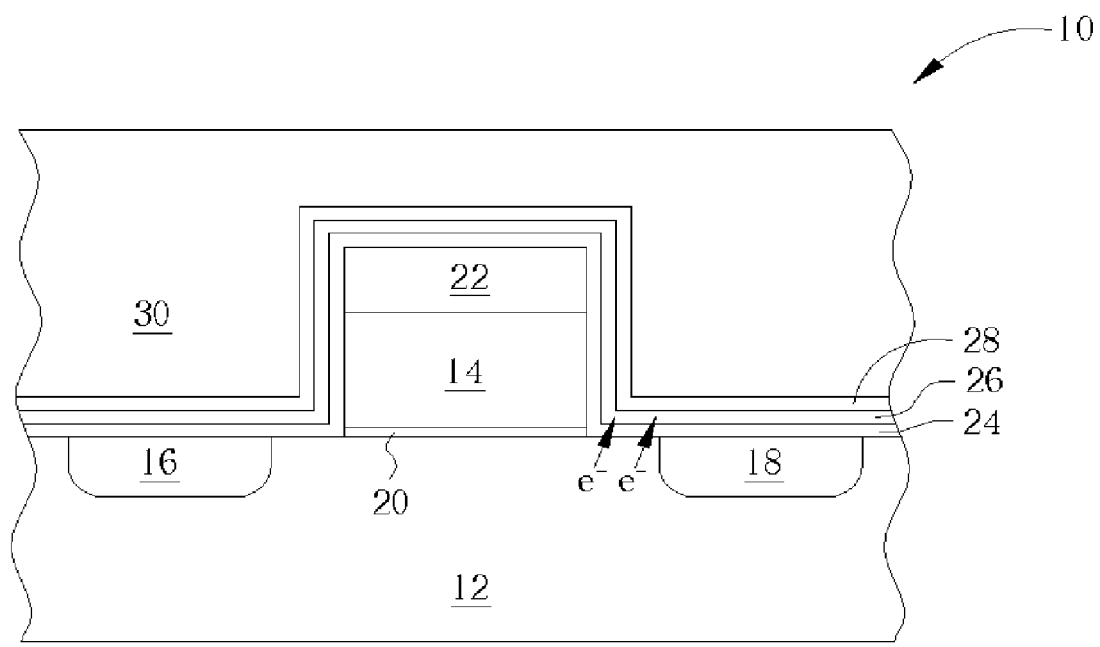
FIG. 1 and FIG. 2 are schematic diagrams of an SPVG SONOS memory.
Figure 2:
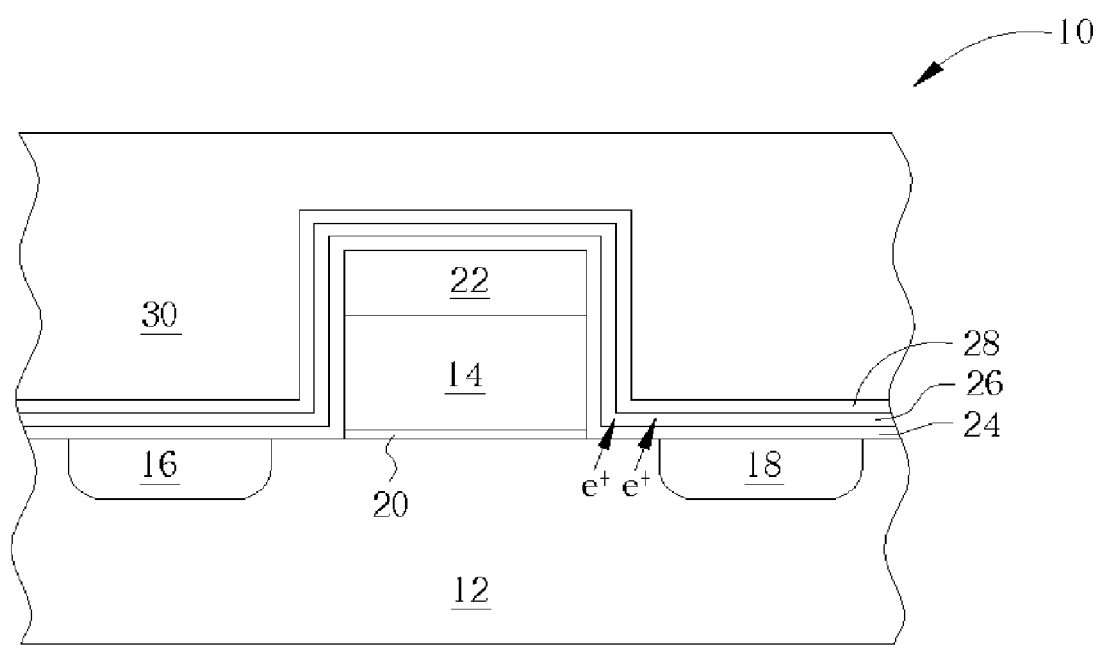
Figure 3:
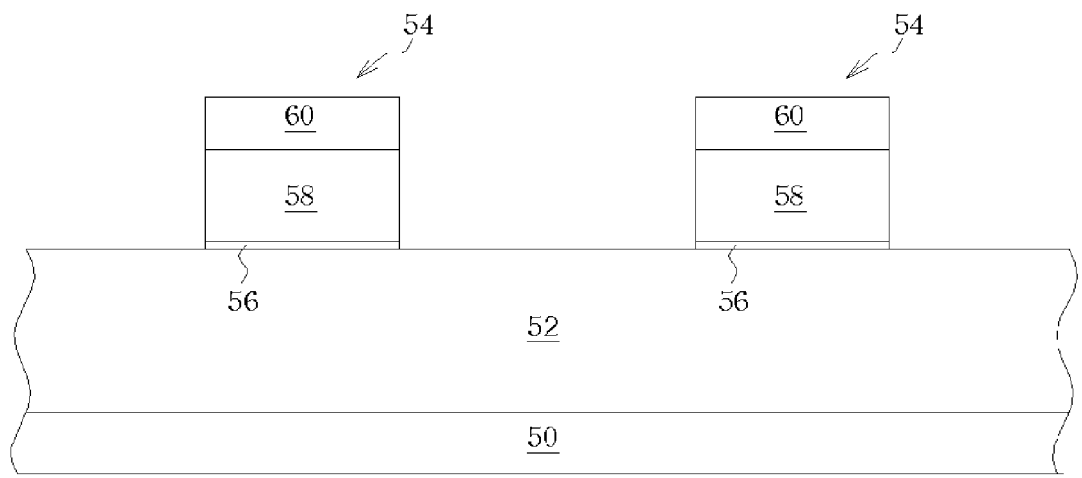
FIG. 3 to FIG. 6 are schematic diagrams illustrating a conventional method of forming an SPVG SONOS memory.
Figure 4:
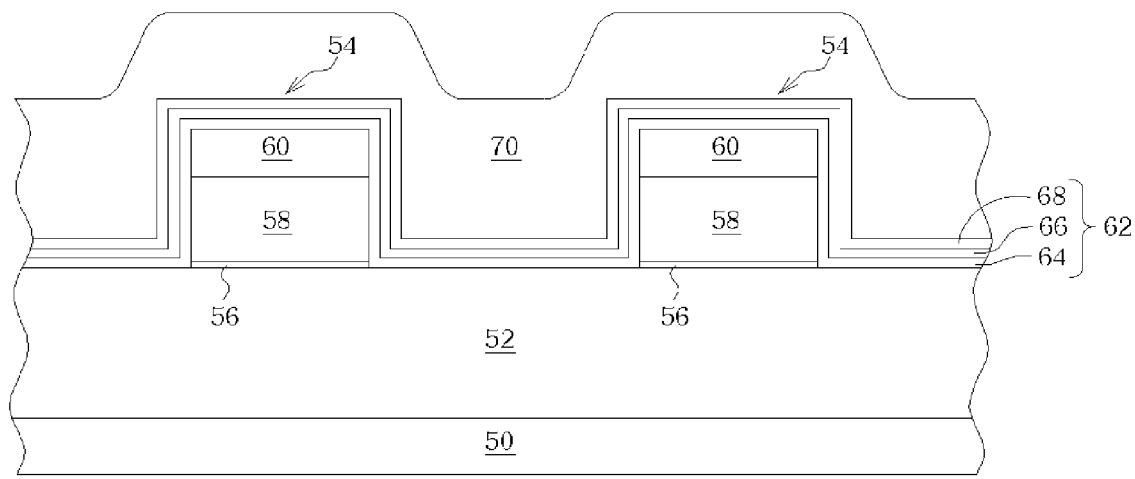
Figure 5:
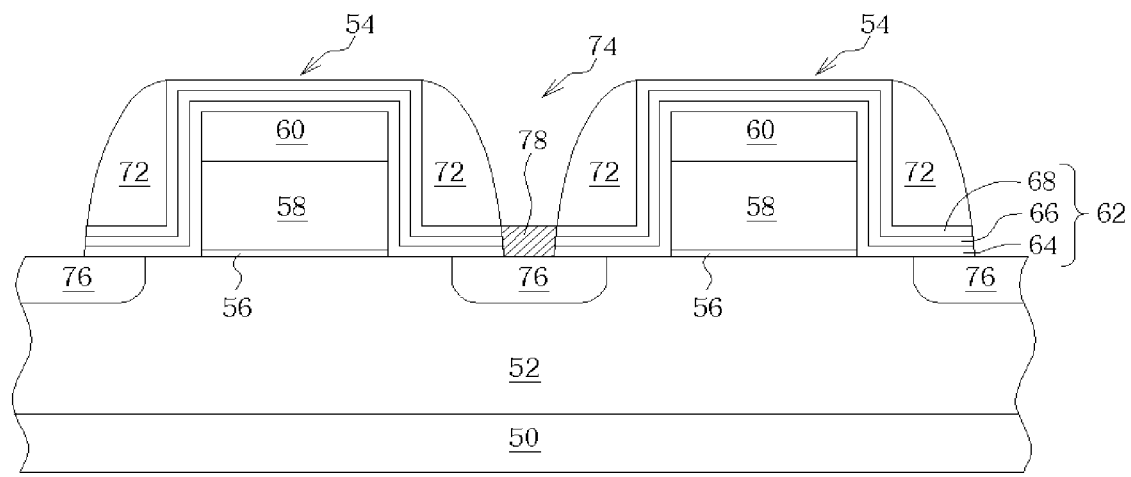
Figure 6:
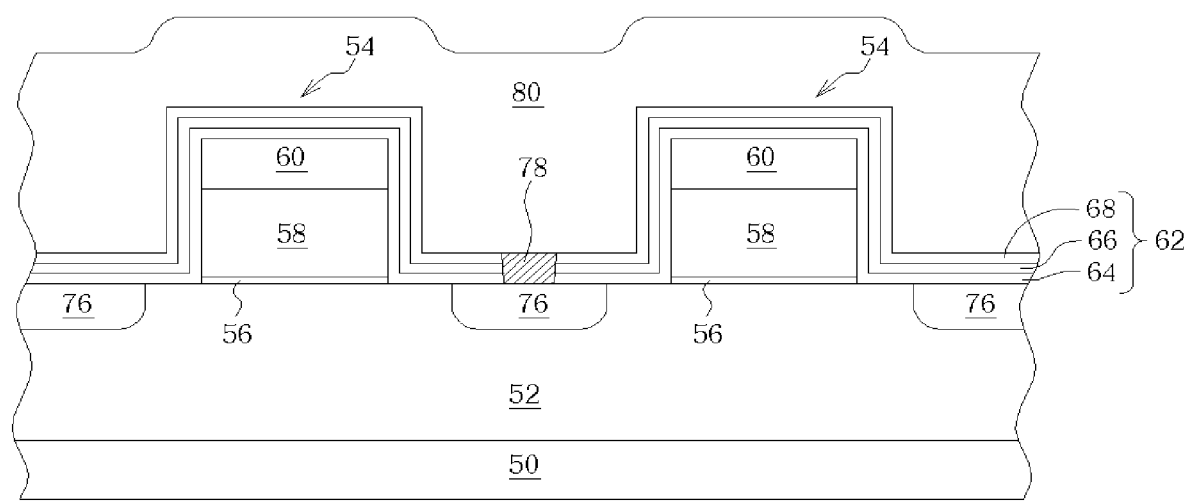
Figure 7:
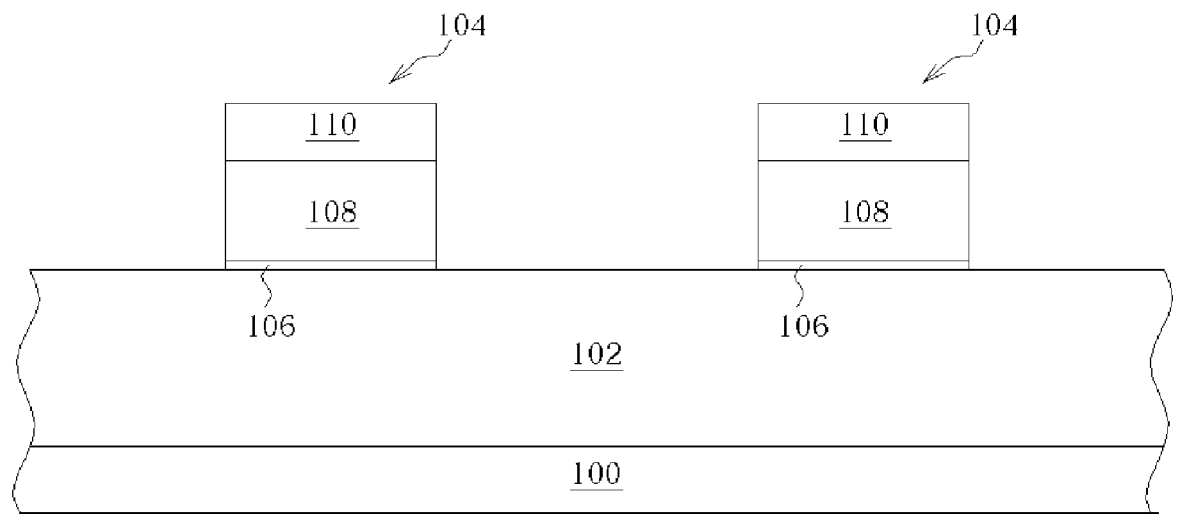
FIG. 7 to FIG. 11 are schematic diagrams illustrating a method of forming an SPVG SONOS memory according to a preferred embodiment of the present invention.
Figure 9:
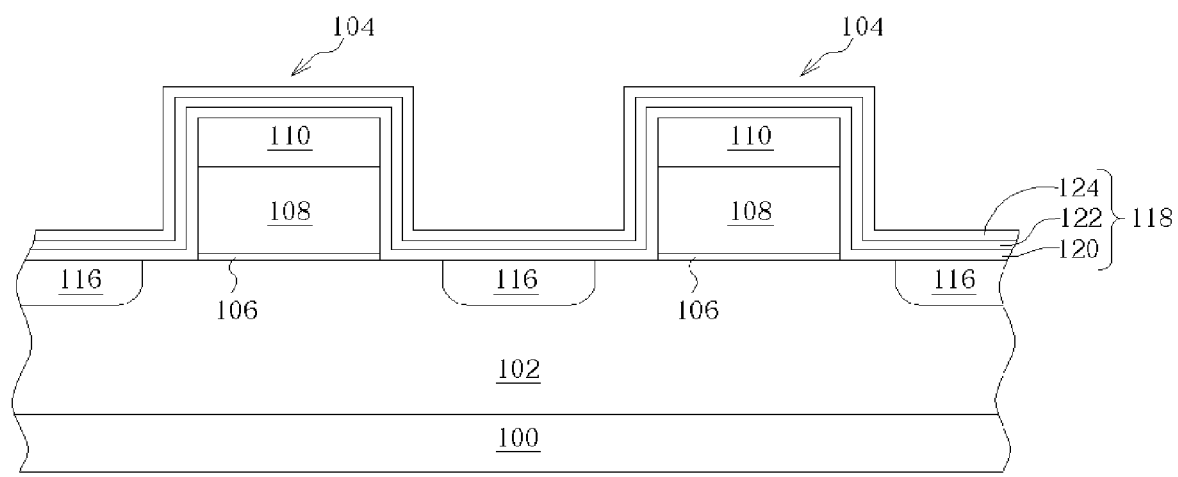
Figure 10:
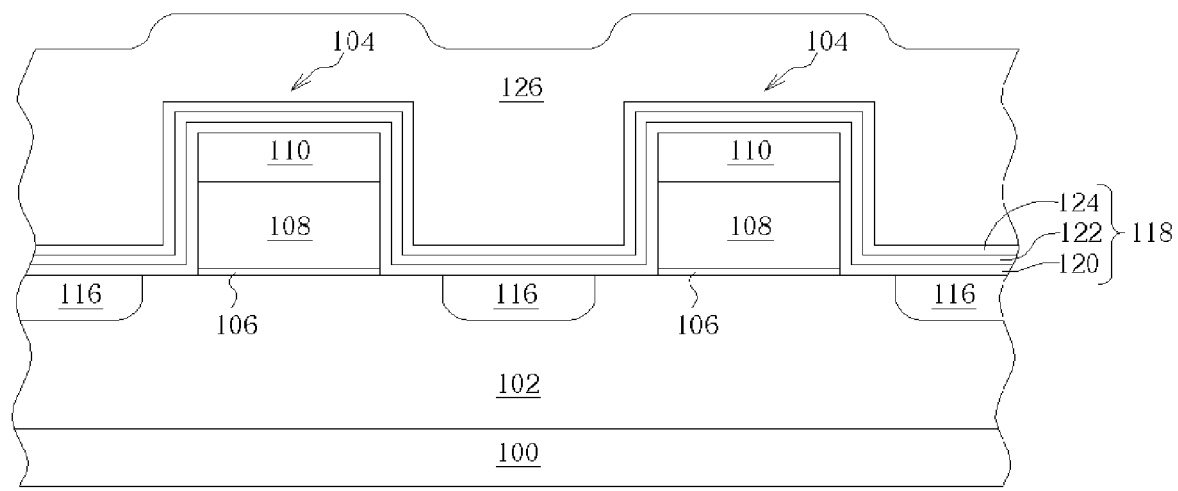
Figure 11:
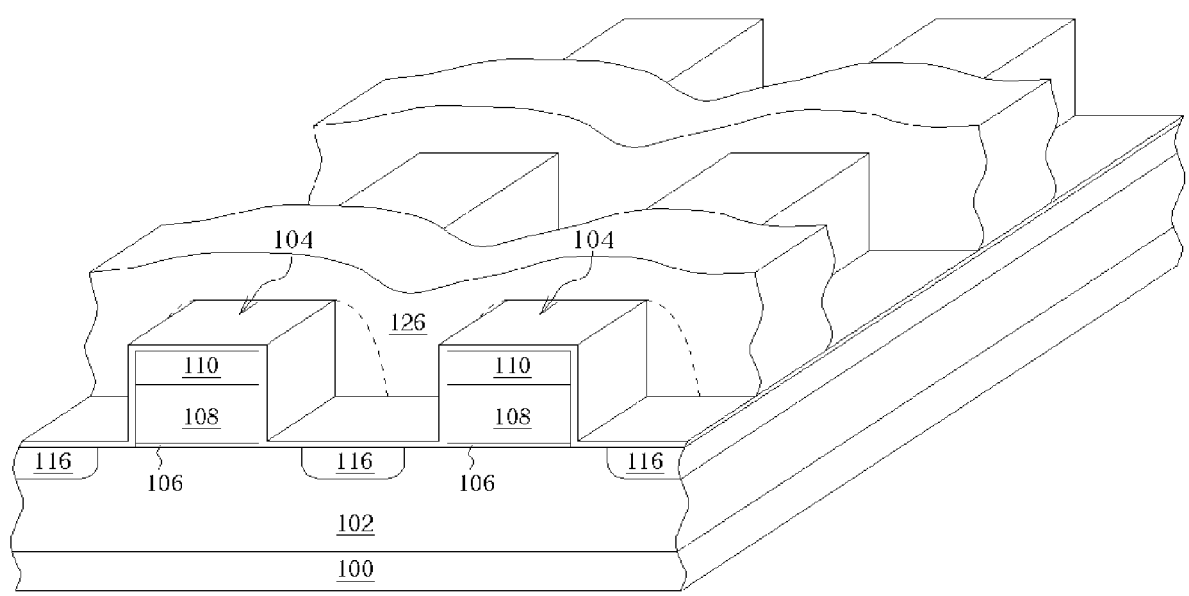

Please refer to FIG. 7 to FIG. 11. FIG. 7 to FIG. 11 are schematic diagrams illustrating a method of forming an SPVG SONOS memory according to a preferred embodiment of the present invention. It is to be appreciated that for emphasizing the defining characteristic of the present invention, FIG. 7 to FIG. 10 are cross-sectional views of some memory cells, and FIG. 11 is a schematic diagram of an SPVG SONOS memory. As shown in FIG. 7, a substrate 100 is provided, and at least a P well 102 is formed in the substrate 100. Then, a plurality of select gate structures 104 are formed on the P well 102. Each select gate structure 104 from bottom to top includes a gate insulating layer 106, a select gate 108, and a cap layer 110. The gate insulating layer 106 is a silicon oxide layer prepared by a thermal oxidization process or a deposition process. The select gate 108 is a polysilicon layer. The cap layer 110 is a silicon nitride layer or a polycide with which the select gate 108 is protected and the sheet resistance is reduced. In addition, the select gate 108 can be alternatively formed by other conductive materials. For example, a metal layer can be utilized to form an SPVG MONOS memory.

Figure 8:
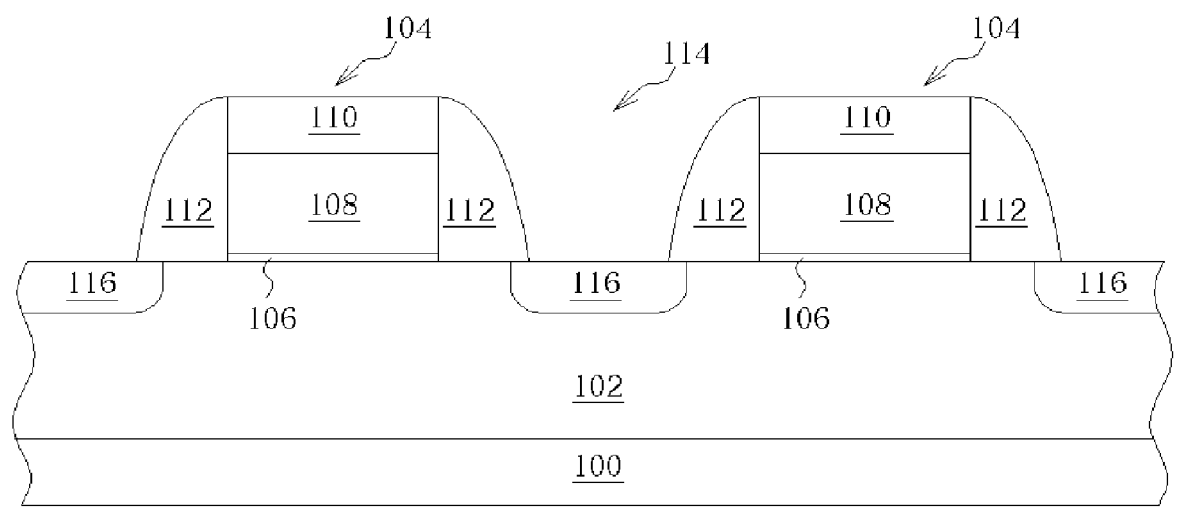

As shown in FIG. 8, a silicon oxide layer (not shown), a silicon nitride layer (not shown), or a polysilicon layer (not shown) is deposited on the substrate 100 and the select gate structures 104, and an etching back process is then performed to form a plurality of sacrificial spacers 112 alongside each select gate structure 104. Meanwhile, a plurality of openings 114 are formed between any two adjacent sacrificial spacers 112 to expose the P well 102. Afterward, an implantation process is performed via each opening 114 to form a plurality of N doped regions 116, serving as buried bit lines, in the P well 102. In addition, a drive-in process is alternatively performed to diffuse the dopants in the N doped regions. It is to be appreciated that this embodiment illustrates the method of forming an NMOS type SPVG SONOS memory, and therefore P well 102 and N doped regions 116 are formed in the substrate 100. If a PMOS type SPVG SONOS memory is to be fabricated, then different dopants must be utilized to form an N well and P doped regions.

It is also to be noted that after the select gate 108 is formed, a liner oxide layer (not shown) can be alternatively formed as an etching stop layer when forming the sacrificial spacers 112. The material of the sacrificial spacers 112 is determined according to the compositions of the cap layer 110 and the substrate 100, or whether the liner oxide layer (not shown) is presented or not, so that a better etching selectivity is obtained. In addition, the liner oxide layer (not shown) can also serve as a sacrificial layer to protect the lattice structure of the N doped regions 116 when performing the implantation process.

As shown in FIG. 9, the sacrificial spacers 112 alongside each select gate structure 104 are removed. Then, a composite dielectric layer 118 is formed on the P well 102, the select gate structure 104, and the N doped regions 116 for being a storage medium of electrons. In this embodiment, the composite dielectric layer 118 is an ONO tri-layer dielectric including a bottom silicon oxide layer 120, a silicon nitride layer 122, and a top silicon oxide layer 124. Other examples of the composite dielectric layer 118 include an oxide/nitride bi-layer dielectric, a nitride/oxide bi-layer dielectric, an oxide/tantalum oxide bi-layer dielectric ($SiO_2$/$Ta_2O_5$), an oxide/tantalum oxide/oxide tri-layer dielectric ($SiO_2$/$Ta_2O_5$/$SiO_2$), an oxide/strontium titanate bi-layer dielectric ($SiO_2$/$SrTiO_3$), an oxide/barium strontium titanate bi-layer dielectric ($SiO_2$/$BaSrTiO_2$), an oxide/strontium titanate/oxide tri-layer dielectric ($SiO_2$/$SrTiO_3$/$SiO_2$), an oxide/strontium titanate/barium strontium titanate tri-layer dielectric ($SiO_2$/$SrTiO_3$/$BaSrTiO_2$), an oxide/hafnium oxide/oxide tri-layer dielectric ($SiO_2$/$Hf_2O_5$/$SiO_2$), and the like (in each case, the first layer mentioned is the bottom layer while the last layer mentioned is the top layer).

As shown in FIG. 10 and FIG. 11, a conductive layer (not shown), such as a polysilicon layer, a metal layer, or a polycide, is entirely deposited on the composite dielectric layer 118, and a photolithography and etching process is performed to define a plurality of parallel word lines 126, which are perpendicular to the select gate structures 104.

As described, according to the method of the present invention, the doped regions are formed in the substrate before forming the composite dielectric layer. Consequently, the composite dielectric layer is not damaged, and therefore possesses good electron capturing abilities. On the other hand, according to the conventional method, the doped regions are formed after forming the composite dielectric layer. This forces the conventional method to form a blocking film to avoid the short circuit between the buried bit lines and the word lines. However, since the composite dielectric layer has been damaged when forming the openings, the SPVG SONOS memory fabricated by the conventional method suffers from an unstable programming voltage or erasing voltage. This seriously affects the reliability.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A method of forming a split programming virtual ground (SPVG) SONOS memory, comprising:

providing a substrate having at least a first conductive type well positioned in the substrate, and a plurality of select gate structures arranged in parallel and positioned on the first conductive type well;

forming a plurality of sacrificial spacers alongside each select gate structure;

performing an implantation process by utilizing the select gate structures and the sacrificial spacers as a mask to form a second conductive type doped region in the first conductive type well between two adjacent select gate structures;

removing the sacrificial spacers;

forming a composite dielectric layer covering the select gate structures subsequent to forming the second conductive type doped region in the first conductive type well between two adjacent select gate structures; and forming a plurality of word lines perpendicular to the select gate structures on the composite dielectric layer.

2. The method of claim 1, wherein each select gate structure from bottom to top comprises a gate insulating layer, a polysilicon layer, and a cap layer.

3. The method of claim 1, wherein the second conductive type doped regions serve as buried bit lines.

4. The method of claim 1, wherein the composite dielectric layer is an ONO tri-layer dielectric.

5. The method of claim 1, wherein the first conductive type well is a P well.

6. The method of claim 5, wherein each second conductive type doped region is an N doped region.

7. A method of forming a dual-bit storage nonvolatile memory, comprising:

providing a plurality of select gate structures arranged in parallel on the substrate;

forming a sacrificial spacer alongside each select gate structure;

performing an implantation process by utilizing the select gate structures and the sacrificial spacers as a mask to form a doped region in the substrate between any two adjacent select gate structures;

removing the sacrificial spacers;

forming a composite dielectric layer covering the select gate structures subsequent to forming the doped region in the substrate between any two adjacent select gate structures; and forming a plurality of word lines perpendicular to the select gate structures on the composite dielectric layer.

8. The method of claim 7, wherein each select gate structure from bottom to top comprises a gate insulating layer and a conductive layer.

9. The method of claim 8, wherein the conductive layer is a polysilicon layer, and the nonvolatile memory is a split programming virtual ground (SPVC) SONOS memory.

10. The method of claim 8, wherein the conductive layer is a metal layer, and the nonvolatile memory is a split programming virtual ground (SPVC) MONOS memory.

11. The method of claim 7, wherein each select gate structure further comprises a cap layer positioned on the conductive layer.

12. The method of claim 7, wherein the substrate further comprises a liner oxide layer positioned on the substrate and covering each select gate structure.

13. The method of claim 7, wherein the doped regions serve as buried bit lines.

14. The method of claim 7, wherein the composite dielectric layer is an ONO tri-layer dielectric.

15. The method of claim 7, wherein the substrate further comprises at least a well, and the select gate structures are positioned on the well.

16. The method of claim 15, wherein the well is a P well, and each doped region is an N doped region.

* * * * *